US009991845B2

(12) United States Patent
Morita et al.

(10) Patent No.: US 9,991,845 B2
(45) Date of Patent: Jun. 5, 2018

(54) GROUND FAULT DETECTION DEVICE

(71) Applicant: OMRON CORPORATION, Kyoto (JP)

(72) Inventors: Kosuke Morita, Saitama (JP); Shuichi Misumi, Kyoto (JP); Yuji Tsurukawa, Shiga (JP)

(73) Assignee: OMRON CORPORATION, Kyoto (JP)

( * ) Notice: Subject to any disclaimer, the term of this patent is extended or adjusted under 35 U.S.C. 154(b) by 0 days. days.

(21) Appl. No.: 15/103,022

(22) PCT Filed: Dec. 10, 2014

(86) PCT No.: PCT/JP2014/082702
§ 371 (c)(1),
(2) Date: Jun. 9, 2016

(87) PCT Pub. No.: WO2015/098523
PCT Pub. Date: Jul. 2, 2015

(65) Prior Publication Data
US 2016/0380589 A1 Dec. 29, 2016

(30) Foreign Application Priority Data

Dec. 27, 2013 (JP) .................. 2013-272530

(51) Int. Cl.
*H01L 31/04* (2014.01)
*H02S 50/10* (2014.01)
(Continued)

(52) U.S. Cl.
CPC .............. *H02S 50/10* (2014.12); *G01R 31/02* (2013.01); *G01R 31/025* (2013.01); *H02H 3/16* (2013.01);
(Continued)

(58) Field of Classification Search
CPC .......... H02S 50/10; H02S 50/00; H02S 40/32; H02S 40/38; H02H 3/16; H02H 7/1222; G01R 31/025; G01R 31/02
See application file for complete search history.

(56) References Cited

U.S. PATENT DOCUMENTS

| 5,712,572 A | 1/1998 | Tamechika et al. |
| 2013/0285670 A1 | 10/2013 | Yoshidomi et al. |
| 2014/0225444 A1* | 8/2014 | Yoshidomi ............... H02H 3/16 307/78 |

FOREIGN PATENT DOCUMENTS

| JP | 08-015345 | 1/1996 |
| JP | 10-127071 | 5/1998 |

(Continued)

OTHER PUBLICATIONS

Search Report issued in WO Application No. PCT/JP2014/082702, dated Mar. 17, 2015.

*Primary Examiner* — David M Gray
*Assistant Examiner* — Michael Harrison
(74) *Attorney, Agent, or Firm* — Greenblum & Bernstein, P.L.C.

(57) ABSTRACT

When a ground fault detection device detects a ground fault of a photovoltaic string, for example, while a power conditioner is in operation, a great current may be flowing in a switching section from the photovoltaic string, so that components resistant to a great current have been used for the switching section. A ground fault detection device includes a stop determination unit configured to determine whether a power converter for converting electric power from a solar battery is in stoppage, and a ground fault detector configured to detect a ground fault of the solar battery in a state where the solar battery and the power converter are electrically disconnected from each other by a disconnection unit arranged between the solar battery and the power converter (Continued)

when the stop determination unit determines that the power converter is in stoppage.

26 Claims, 5 Drawing Sheets

(51) Int. Cl.
    *H02H 3/16*         (2006.01)
    *G01R 31/02*      (2006.01)
    *H02H 7/122*      (2006.01)
    *H02S 50/00*       (2014.01)
    *H02S 40/32*       (2014.01)
    *H02S 40/38*       (2014.01)

(52) U.S. Cl.
    CPC ........... *H02H 7/1222* (2013.01); *H02S 50/00* (2013.01); *H02S 40/32* (2014.12); *H02S 40/38* (2014.12)

(56) References Cited

FOREIGN PATENT DOCUMENTS

| | | |
|---|---|---|
| JP | 2000-040838 | 2/2000 |
| JP | 2001-21606 | 1/2001 |
| JP | 2001-298850 | 10/2001 |
| JP | 2012-119382 | 6/2012 |

\* cited by examiner

GROUND FAULT DETECTION DEVICE

TECHNICAL FIELD

The present invention relates to a ground fault detection device and a program.

BACKGROUND ART

Patent Document 1 discloses a ground fault detection device for detecting a ground fault of a photovoltaic string in a state where the photovoltaic string and a power conditioner are electrically disconnected from each other by a switching section provided between the photovoltaic string and the power conditioner.

Patent Document 1: Japanese Unexamined Patent Publication No. 2012-119382

SUMMARY OF THE INVENTION

Problem to be Solved by the Invention

When such a ground fault detection device as described above detects a ground fault of the photovoltaic string, for example, while the power conditioner is in operation, a great current may be flowing in the switching section from the photovoltaic string, so that components resistant to a great current have been used for the switching section.

Means for Solving the Problem

A ground fault detection device according to an aspect of the invention includes a stop determination unit configured to determine whether a power converter for converting electric power from a solar battery is in stoppage, and a ground fault detector configured to detect a ground fault of the solar battery in a state where the solar battery and the power converter are electrically disconnected from each other by a disconnection unit arranged between the solar battery and the power converter when the stop determination unit determines that the power converter is in stoppage.

The above ground fault detection device may further include a voltage value acquisition unit configured to acquire a voltage value of a voltage output from the solar battery. The ground fault detector may detect a ground fault of the solar battery when the voltage value acquired by the voltage value acquisition unit is larger than a first reference voltage value.

In the above ground fault detection device, the stop determination unit may determine that the power converter is in stoppage when the voltage value acquired by the voltage value acquisition unit is smaller than a second reference voltage value.

In the above ground fault detection device, the stop determination unit may determine that the power converter is in stoppage when the voltage value acquired by the voltage value acquisition unit is smaller than the second reference voltage value, and a present timing is included in a predetermined period.

In the above ground fault detection device, the stop determination unit may determine that the power converter is in stoppage when a change in the voltage value acquired by the voltage value acquisition unit satisfies a predetermined condition.

In the above ground fault detection device, the stop determination unit may determine that the power converter is in stoppage when the change in the voltage value acquired by the voltage value acquisition unit satisfies the predetermined condition, and a present timing is included in a predetermined period.

The above ground fault detection device may further include a current value acquisition unit configured to acquire a current value of a current output from the solar battery. The stop determination unit may determine that the power converter is in stoppage when the voltage value acquired by the voltage value acquisition unit is smaller than the second reference voltage value, and the current value acquired by the current value acquisition unit is smaller than a reference current value.

In the above ground fault detection device, the stop determination unit may determine that the power converter is in stoppage when the voltage value acquired by the voltage value acquisition unit is smaller than the second reference voltage value, the current value acquired by the current value acquisition unit is smaller than the reference current value, and a present timing is included in a predetermined period.

The above ground fault detection device may further include a solar radiation amount acquisition unit configured to acquire a solar radiation amount. The stop determination unit may determine that the power converter is in stoppage when the solar radiation amount acquired by the solar radiation amount acquisition unit satisfies a predetermined condition.

In the above ground fault detection device, the stop determination unit may determine that the power converter is in stoppage when the solar radiation amount acquired by the solar radiation amount acquisition unit satisfies the predetermined condition, and the voltage value acquired by the voltage value acquisition unit is smaller than a second reference voltage value.

In the above ground fault detection device, the stop determination unit may determine that the power converter is in stoppage when the solar radiation amount acquired by the solar radiation amount acquisition unit satisfies the predetermined condition, and a change in the voltage value acquired by the voltage value acquisition unit satisfies a predetermined condition.

The above ground fault detection device may further include a current value acquisition unit configured to acquire a current value of a current output from the solar battery. The stop determination unit may determine that the power converter is in stoppage when the solar radiation amount acquired by the solar radiation amount acquisition unit satisfies the predetermined condition, the voltage value acquired by the voltage value acquisition unit is smaller than the second reference voltage value, and the current value acquired by the current value acquisition unit is smaller than a reference current value.

A ground fault detection device according to an aspect of the invention includes a voltage value acquisition unit configured to acquire a voltage value of a voltage output from a solar battery, and a ground fault detector configured to detect a ground fault of the solar battery in a state where the solar battery and a power converter for converting electric power from the solar battery are electrically disconnected from each other by a disconnection unit arranged between the solar battery and the power converter when the voltage value acquired by the voltage value acquisition unit is larger than a first reference voltage value and smaller than a second reference voltage value, or when the voltage value is larger than the first reference voltage value, and a change in the voltage value satisfies a predetermined condition.

In the above ground fault detection device, the ground fault detector may detect a ground fault of the solar battery in a state where the solar battery and the power converter are electrically disconnected from each other by the disconnection unit when the voltage value acquired by the voltage value acquisition unit is larger than the first reference voltage value and smaller than the second reference voltage value, and a present timing is included in a predetermined period, or when the voltage value is larger than the first reference voltage value, the change in the voltage value satisfies the predetermined condition, and the present timing is included the predetermined period.

A ground fault detection device according to an aspect of the invention includes a voltage value acquisition unit configured to acquire a voltage value of a voltage output from a solar battery, a current value acquisition unit configured to acquire a current value of a current output from the solar battery, and a ground fault detector configured to detect a ground fault of the solar battery in a state where the solar battery and a power converter for converting electric power from the solar battery are electrically disconnected from each other by a disconnection unit arranged between the solar battery and the power converter when the voltage value acquired by the voltage value acquisition unit is larger than a reference voltage value, and the current value acquired by the current value acquisition unit is smaller than a reference current value.

A ground fault detection device according to an aspect of the invention includes a solar radiation amount acquisition unit configured to acquire a solar radiation amount, and a ground fault detector configured to detect a ground fault of a solar battery in a state where the solar battery and a power converter for converting electric power from the solar battery are electrically disconnected from each other by a disconnection unit arranged between the solar battery and the power converter when the solar radiation amount acquired by the solar radiation amount acquisition unit satisfies a predetermined condition.

The above ground fault detection device may further include a voltage value acquisition unit configured to acquire a voltage value of a current output from the solar battery. The ground fault detector may detect a ground fault of the solar battery in a state where the solar battery and the power converter are electrically disconnected from each other by the disconnection unit when the solar radiation amount acquired by the solar radiation amount acquisition unit satisfies the predetermined condition, and the voltage value acquired by the voltage value acquisition unit is larger than a first reference voltage value and smaller than a second reference voltage value, or when the solar radiation amount satisfies the predetermined condition, the voltage value is larger than the first reference voltage value, and a change in the voltage value satisfies a predetermined condition.

In the above ground fault detection device, the disconnection unit may be a relay including a b-contact.

The above ground fault detection device may further include a power supply unit configured to supply electric power from the solar battery to the ground fault detection device.

The above summary of the invention is not intended to enumerate all of the features of the present invention. The sub-combinations of the features may also constitute the invention.

MODE FOR CARRYING OUT THE INVENTION

Hereinafter, the invention will be described in terms of an embodiment of the invention, but the following embodiment does not limit the invention according to the claims. In addition, all combinations of the features described in the embodiment are not necessarily essential for solving means of the invention.

Figure 1:
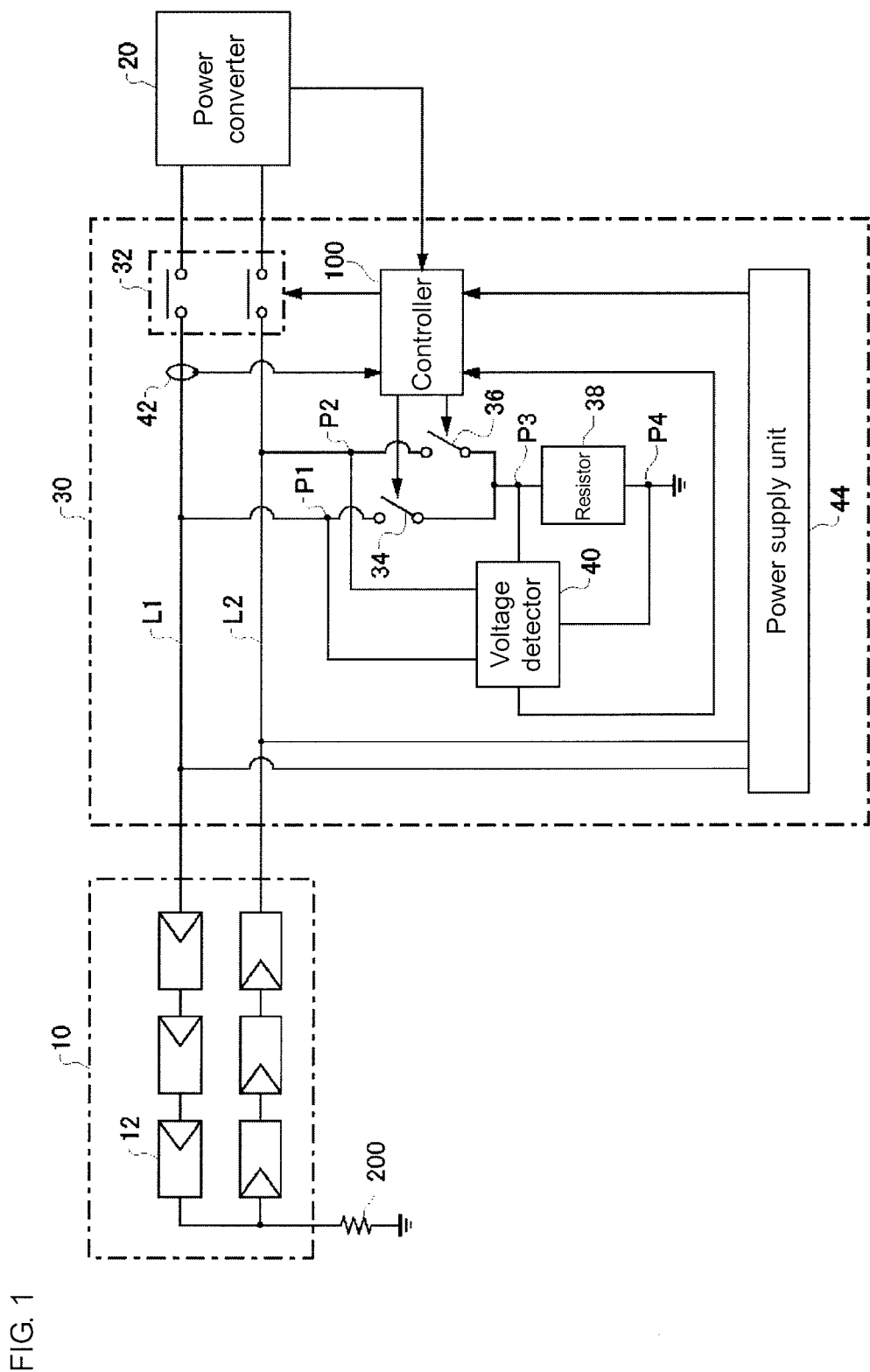
FIG. 1 is a diagram illustrating an example of the entire configuration of a photovoltaic power system including a ground fault detection device according to an embodiment of the present invention.

FIG. 1 illustrates an example of the entire configuration of a photovoltaic power system including a ground fault detection device 30 according to the embodiment.

The photovoltaic power system includes a solar battery 10, a power converter 20, and the ground fault detection device 30. The solar battery 10 may be a photovoltaic string having a plurality of photovoltaic modules 12 connected in series. The solar battery 10 may be a single solar battery, a photovoltaic module that is solar batteries connected in series or in parallel, or the like.

The power converter 20 converts the electric power output from the solar battery 10. The power converter 20 may be a power conditioner that boosts direct current from the solar battery 10 and converts the boosted direct current into alternate current to connect with a system power supply.

The ground fault detection device 30 derives an insulation resistance value between the solar battery 10 and a ground point, and determines that a ground fault occurs when the derived insulation resistance value is less than a reference resistance value.

The ground fault detection device 30 includes a disconnection unit 32, a switch 34, a switch 36, a resistor 38, a voltage detector 40, a current sensor 42, a power supply unit 44, and a controller 100.

The disconnection unit 32 is arranged between the solar battery 10 and the power converter 20, and electrically disconnects between the solar battery 10 and the power converter 20. The disconnection unit 32 includes a relay provided between an output terminal of the solar battery 10 on a high potential side and an input terminal of the power converter 20 on a high potential side, and a relay provided between an output terminal of the solar battery 10 on a low potential side and an input terminal of the power converter 20 on a low potential side. Each of the relays may be a relay having a b-contact that electrically disconnects between the solar battery 10 and the power converter 20 when an operational signal is input.

The relay of the disconnection unit 32 on the high potential side and the output terminal of the solar battery 10 on the high potential side are connected via an electric wire L1 on the high potential side. The relay of the disconnection unit 32 on the low potential side and the output terminal of the solar battery 10 on the low potential side are connected via an electric wire L2 on the low potential side.

One end of the switch 34 is connected to the electric wire L1 on the high potential side, and the other end of the switch 34 is connected to one end of the resistor 38. One end of the switch 36 is connected to the electric wire L2 on the low potential side, and the other end of the switch 36 is connected to the one end of the resistor 38. The other end of the resistor 38 is grounded.

The voltage detector 40 detects a voltage V1 between point P3 on the electric wire connecting the switch 34 with the one end of the resistor 38 and point P4 of the resistor 38 on the other end side in the state where the switch 34 is on and the switch 36 is off. The voltage detector 40 detects a voltage V2 between point P3 and point P4 in the state where the switch 34 is off and the switch 36 is on. The voltage detector 40 detects a voltage V0 between point P1 on the electric wire connecting the electric wire L1 with the one end of the switch 34 and point P2 on the electric wire connecting the electric wire L2 with the one end of the switch 36 in the state where the switch 34 is off and the switch 36 is off. The voltage V0 corresponds to the voltage across both the terminals of the solar battery 10.

The current sensor 42 detects a current value I0 of the current output from the solar battery 10. The controller 100 controls operation of the relays of the disconnection unit 32. The controller 100 controls switching operation of the switch 34 and the switch 36. The controller 100 also derives a resistance value R0 of an insulation resistor 200 of the solar battery 10 based on the voltage V1, voltage V2, and voltage V0 detected by the voltage detector 40, and detects the presence or absence of a ground fault of the solar battery 10 based on the resistance value R0.

When the resistance value of the resistor 38 is denoted by R1, the electromotive force of the solar battery 10 is denoted by E, the current output from the solar battery 10 is denoted by I, the resistance value of the solar battery 10 is denoted by Rpv, and the electric potential of point P1 in the state where the switch 34 is on and the switch 36 is off is denoted by Va, Equation (1) can be derived from Ohm's law.

$$R0+Rpv+R1=E/I=Va/(V1/R1)=Va/V1\times R1 \quad (1)$$

Herein, when Rpv=0 supposing that Rpv is sufficiently small as compared with R0 and R1, the resistance value R0 can be derived from Equation (2).

$$R0=Va/V1\times R1-R1 \quad (2)$$

When the resistance value of the resistor 38 is denoted by R1, the electromotive force of the solar battery 10 is denoted by E, the current output from the solar battery 10 is denoted by I, the resistance value of the solar battery 10 is denoted by Rpv, and the electric potential of point P2 in the state where the switch 34 is off and the switch 36 is on is denoted by Vb, Equation (3) can be derived from Ohm's law.

$$R0+Rpv+R1=E/I=Vb/(V2/R1)=Vb/V2\times R1 \quad (3)$$

Herein, when Rpv=0 supposing that Rpv is sufficiently small as compared with R0 and R1, the resistance value R0 can be derived from Equation (4).

$$R0=Vb/V2\times R1-R1 \quad (4)$$

The resistance value R0 can be derived from Equation (5), since Equation (2), Equation (4), and |Va−Vb|=V0 are satisfied.

$$R0=R1\times |Va-Vb|/|V1-V2|-R1=R1\times V0/|V1-V2|-R1 \quad (5)$$

The controller 100 thus can derive the resistance value R0 according to Equation (5). Note that the controller 100 may derive the resistance value R0 according to Equation (2) or Equation (4) when detecting the electric potential Va or the electric potential Vb.

The controller 100 determines that no ground fault occurs in the solar battery 10 when the resistance value R0 is not less than a predetermined reference resistance value Rt. The controller 100 determines that a ground fault occurs in the solar battery 10 when the resistance value R0 is less than the reference resistance value Rt. The power supply unit 44 supplies the electric power supplied from the solar battery 10 to the controller 100.

The ground fault detection device 30 configured as described above electrically disconnects between the solar battery 10 and the power converter 20 by the disconnection unit 32 to detect a ground fault of the solar battery 10 when the voltage output from the solar battery 10 is small. The ground fault detection device 30 may electrically disconnect between the solar battery 10 and the power converter 20 by the disconnection unit 32 to detect a ground fault of the solar battery 10 when a voltage value Vin of the voltage output from the solar battery 10 and input to the power converter 20 is larger than a predetermined first reference voltage value Vt1 and smaller than a predetermined second reference voltage value Vt2 (>Vt1). The first reference voltage value Vt1 should be a value not less than the minimum voltage value that allows the ground fault detection device 30 to detect a ground fault of the solar battery 10 without being affected by noise. The second reference voltage value Vt2 should be a value not more than the maximum voltage value that limits a required electric power output from the power converter 20. The power converter 20 converts direct current input from the solar battery 10 into alternate current having a required voltage for output when a voltage larger than the second reference voltage value Vt2 is input from the solar battery 10.

When the voltage output from the solar battery 10 is small, the power converter 20 is highly likely to be in stoppage, so that the ground fault detection device 30 may electrically disconnect between the solar battery 10 and the power converter 20 by the disconnection unit 32 while the power converter 20 is in stoppage to detect a ground fault of the solar battery 10.

When the voltage value Vin of the voltage output from the solar battery 10 and input to the power converter 20 is larger than the predetermined first reference voltage value Vt1, and when the voltage value Vin is smaller than the predetermined second reference voltage value Vt2 (>Vt1) and the current I0 output from the solar battery 10 is smaller than a reference current value It, the power converter 20 is highly likely to be in stoppage, so that the ground fault detection device 30 may electrically disconnect between the solar battery 10 and the power converter 20 by the disconnection unit 32 while the power converter 20 is in stoppage to detect a ground fault of the solar battery 10.

The above limitations of the timing for detecting a ground fault of the solar battery 10 by the ground fault detection device 30 allow the disconnection unit 32 to operate only when the current flowing in the disconnection unit 32 is small. Limiting the timing for operating the disconnection unit 32 to the case where the current flowing in the disconnection unit 32 is small prevents the disconnection unit 32 from being operated when the current flowing in the disconnection unit 32 is large. This eliminates the need to select components resistant to a great current as the components making up the disconnection unit 32 on the assumption that the current flowing in the disconnection unit 32 is large. Moreover, this eliminates the need to select expensive components resistant to a great current as the relays making up the disconnection unit 32. This also allows the relays making up the disconnection unit 32 to be downsized.

Figure 2:
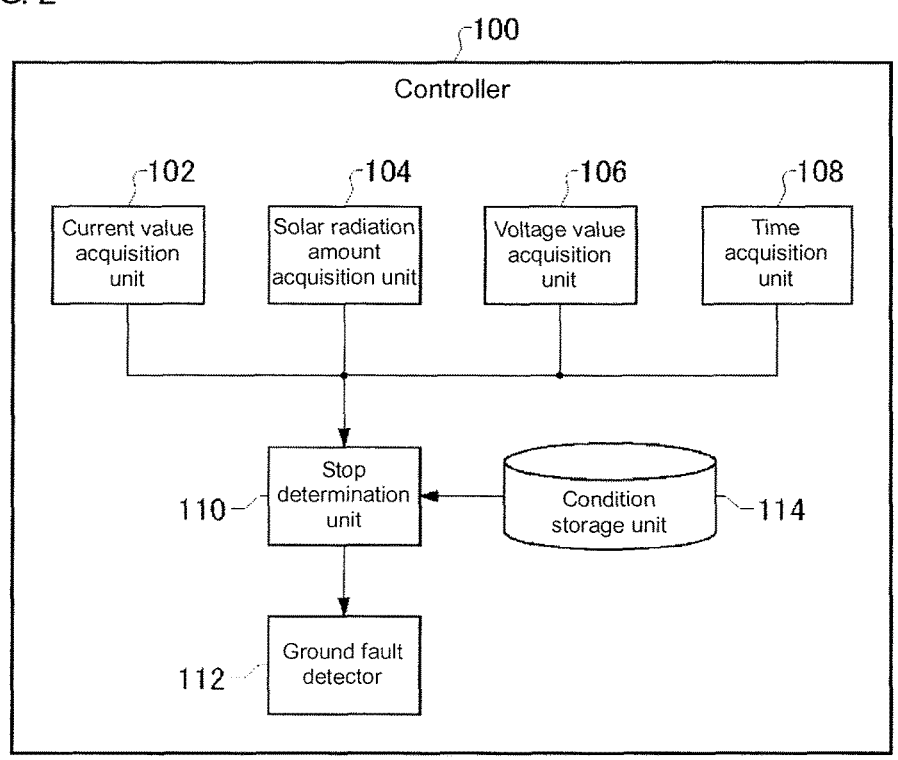
FIG. 2 is a diagram illustrating an example of a function block of a controller.

FIG. 2 is a diagram illustrating an example of a function block of the controller 100. The controller 100 includes a current value acquisition unit 102, a solar radiation amount acquisition unit 104, a voltage value acquisition unit 106, a time acquisition unit 108, a stop determination unit 110, a ground fault detector 112, and a condition storage unit 114.

Each unit and the like of the controller 100 may be provided by a computer with an installed program, which is stored in a recording medium capable of being read by the computer, for causing the computer to execute various kinds of processing relating to detection of a ground fault of the solar battery 10. That is, the ground fault detection device 30 may be provided by a computer that executes, as each unit and the like of the controller 100, a program for performing various kinds of processing relating to detection of a ground fault of the solar battery 10.

The computer includes a CPU, various memories such as a ROM, a RAM, and an EEPROM (registered trademark), a communication bus, and an interface, and functions as the ground fault detection device 30 by reading out and sequentially performing, with the CPU, a processing program preliminarily stored in the ROM as firmware.

The current value acquisition unit 102 acquires the current value I0 of the current output from the solar battery 10 and detected by the current sensor 42. The solar radiation amount acquisition unit 104 acquires the current solar radiation amount from an actinometer not shown. The voltage value acquisition unit 106 acquires the voltage value Vin of the voltage input to the power converter 20. The voltage value acquisition unit 106 may acquire the voltage V0 between point P1 and point P2 detected by the voltage detector 40 as the voltage value Vin. The power converter 20 includes a voltage sensor for detecting the voltage input to the power converter 20. The voltage value acquisition unit 106 may acquire the voltage value Vin from the voltage sensor equipped in the power converter 20. The time acquisition unit 108 acquires the present time. The time acquisition unit 108 may acquire the present time from an atomic clock not shown.

The stop determination unit 110 determines whether the power converter 20 that converts the electric power from the solar battery 10 is in stoppage. The period when the power converter 20 is in stoppage may be a period when the power converter 20 performs no conversion processing of the electric power from the solar battery 10. When the power converter 20 includes a boost circuit for boosting the direct current from the solar battery 10, the period when the power converter 20 is in stoppage may be a period when the boost circuit equipped in the power converter 20 is performing no boost operation.

When the stop determination unit 110 determines that the power converter 20 is in stoppage, the ground fault detector 112 detects a ground fault of the solar battery 10 in the state where the solar battery 10 and the power converter 20 are electrically disconnected from each other by the disconnection unit 32 provided between the solar battery 10 and the power converter 20.

The ground fault detector 112 derives the resistance value R0 of the insulation resistor 200 of the solar battery 10 according to above Equation (5) based on the voltage V1, voltage V2, and voltage V0 detected by the voltage detector 40. The ground fault detector 112 also detects the presence or absence of a ground fault of the solar battery 10 based on the resistance value R0.

The condition storage unit 114 stores various reference values to be used as determination criteria when the stop determination unit 110 determines whether the power converter 20 is in stoppage.

When the solar battery 10 generates no electric power in the night for example, almost no current flows in the resistor 38. When the current flowing in the resistor 38 is too small, the ground fault detector 112 fails to discriminate the voltage value detected by the voltage detector 40 from noise. Consequently, when the voltage value detected by the voltage detector 40 is too small, the ground fault detector 112 fails to precisely derive the resistance value R0 of the insulation resistor 200 of the solar battery 10. The ground fault detector 112 thus may detect a ground fault of the solar battery 10 when the voltage value Vin acquired by the voltage value acquisition unit 106 is larger than the first reference voltage value Vt1 stored in the condition storage unit 114.

When the electric power output from the solar battery 10 is too small, the power converter 20 fails to output desired electric power, so that the power converter 20 is in stoppage. Thus, when the voltage value Vin acquired by the voltage value acquisition unit 106 is smaller than the second reference voltage value Vt2 stored in the condition storage unit 114, the stop determination unit 110 may determine that the power converter 20 is in stoppage. When the voltage value Vin is smaller than the second reference voltage value Vt2, and the current value I0 acquired by the current value acquisition unit 102 is smaller than the reference current value It stored in the condition storage unit 114, the stop determination unit 110 may determine that the power converter 20 is in stoppage.

The electric power output from the solar battery 10 is highly likely to be small in the morning and evening when no sufficient sunlight falls on the solar battery 10. Consequently, the power converter 20 is highly likely to be in stoppage in the morning and evening, because the power converter 20 fails to output desired electric power. Thus, when the present timing is included in a predetermined period, such as a predetermined time period in the morning or a predetermined time period in the evening, and the voltage value Vin acquired by the voltage value acquisition unit 106 is smaller than the second reference voltage value Vt2 stored in the condition storage unit 114, the stop determination unit 110 may determine that the power converter 20 is in stoppage. When the present timing is included in a predetermined period, the voltage value Vin is smaller than the second reference voltage value Vt2, and the current value I0 acquired by the current value acquisition unit 102 is smaller than the reference current value It, the stop determination unit 110 may determine that the power converter 20 is in stoppage.

When the solar radiation amount is small, the electric power output from the solar battery 10 is small, so that the power converter 20 is highly likely to be in stoppage due to failing to output desired electric power. Thus, when the solar radiation amount acquired by the solar radiation amount acquisition unit 104 satisfies a predetermined condition, and the voltage value Vin acquired by the voltage value acquisition unit 106 is smaller than the second reference voltage value Vt2 stored in the condition storage unit 114, the stop determination unit 110 may determine that the power converter 20 is in stoppage. When the solar radiation amount acquired by the solar radiation amount acquisition unit 104 satisfies a predetermined condition, the voltage value Vin is smaller than the second reference voltage value Vt2, and the current value I0 acquired by the current value acquisition unit 102 is smaller than the reference current value It, the stop determination unit 110 may determine that the power converter 20 is in stoppage.

When the solar radiation amount shows a change, i.e. a gradual increase after the period in which the solar radiation amount is zero has continued, the stop determination unit 110 may determine that now is the morning when the electric power output from the solar battery 10 is small to determine that the power converter 20 is in stoppage when the voltage value Vin is smaller than the second reference voltage value Vt2. When the solar radiation amount shows a change, i.e. a gradual increase after the period in which the solar radiation amount is zero has continued, the stop determination unit 110 may determine that now is the morning when the electric power output from the solar battery 10 is small to determine that the power converter 20 is in stoppage when the voltage value Vin is smaller than the second reference voltage value Vt2, and the current value I0 acquired by the current value acquisition unit 102 is smaller than the reference current value It stored in the condition storage unit 114.

When the solar radiation amount shows a change, i.e. a gradual decrease after the period in which the solar radiation amount is relatively large has continued, the stop determination unit 110 may determine that now is the evening when the electric power output from the solar battery 10 is small to determine that the power converter 20 is in stoppage when the voltage value Vin is smaller than the second reference voltage value Vt2. When the solar radiation amount shows a change, i.e. a gradual decrease after the period in which the solar radiation amount is relatively large has continued, the stop determination unit 110 may determine that now is the evening when the electric power output from the solar battery 10 is small to determine that the power converter 20 is in stoppage when the voltage value Vin is smaller than the second reference voltage value Vt2, and the current value I0 is smaller than the reference current value It.

Figure 3:
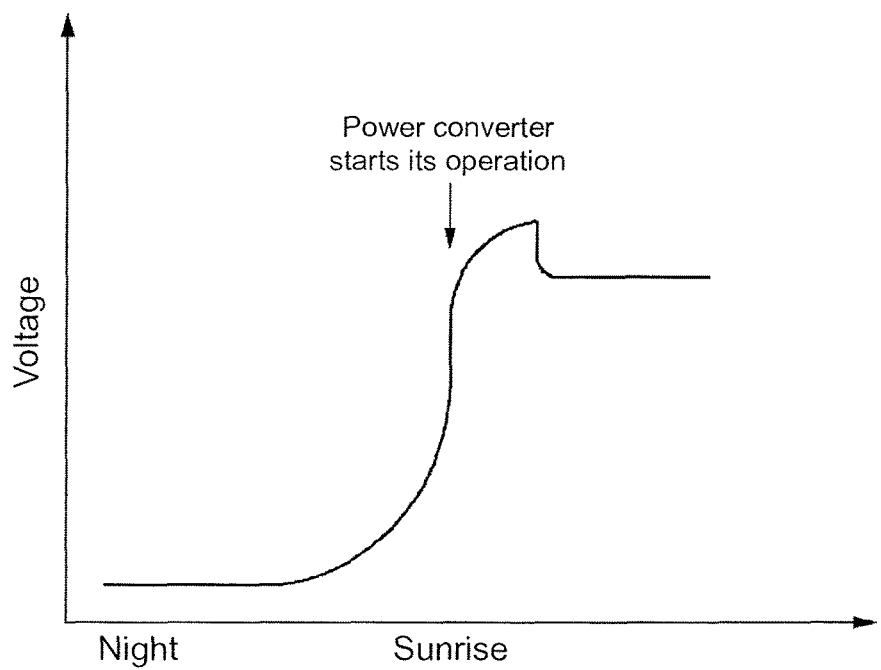
FIG. 3 is a diagram illustrating an example of change in the voltage input to a power converter in the morning.
Figure 4:
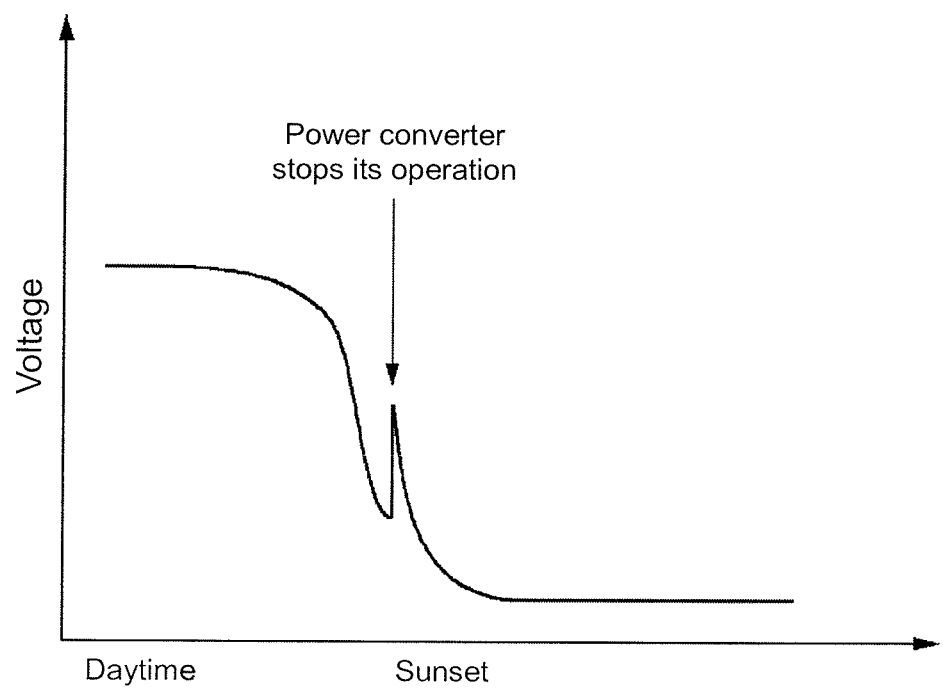
FIG. 4 is a diagram illustrating an example of change in the voltage input to the power converter in the evening.

Moreover, as illustrated in FIG. 3, when the electric power output from the solar battery 10 gradually increases and the power converter 20 starts its operation in the morning, the voltage input to the power converter 20 rapidly drops. Moreover, as illustrated in FIG. 4, when the electric power output from the solar battery 10 gradually decreases and the power converter 20 stops its operation in the evening, the voltage input to the power converter 20 once rapidly rises and then drops. In this manner, whether the power converter 20 is in stoppage can be determined based on a change in the voltage input to the power converter 20.

Thus, when a change in the voltage value Vin acquired by the voltage value acquisition unit 106 satisfies a predetermined condition, the stop determination unit 110 may determine that the power converter 20 is in stoppage.

When the voltage value Vin acquired by the voltage value acquisition unit 106 has not yet showed a rapid change, i.e. a rapid drop although shows a gradual increase, the stop determination unit 110 may determine that the voltage value Vin shows a change in the morning when the power converter 20 has not yet started its operation to determine that the power converter 20 is in stoppage. When the voltage value Vin acquired by the voltage value acquisition unit 106 rapidly increases and then shows a change, i.e. a decrease, the stop determination unit 110 may determine that the voltage value Vin shows a change in the evening when the power converter 20 has just stopped to determine that the power converter 20 is in stoppage.

When the solar radiation amount acquired by the solar radiation amount acquisition unit 104 satisfies a predetermined condition, and a change in the voltage value Vin acquired by the voltage value acquisition unit 106 satisfies a predetermined condition, the stop determination unit 110 may determine that the power converter 20 is in stoppage. When a change in the solar radiation amount shows a change in the morning or evening, and the voltage value Vin shows a change in the morning when the power converter 20 has not yet started its operation or shows a change in the evening when the power converter 20 has just stopped, the stop determination unit 110 may determine that the power converter 20 is in stoppage.

When a change in the voltage value Vin acquired by the voltage value acquisition unit satisfies a predetermined condition, and the present timing is included in a predetermined period, the stop determination unit 110 may determine that the power converter 20 is in stoppage. When the present time acquired by the time acquisition unit 108 is included in a predetermined time period in the morning or evening, and the voltage value Vin shows a change in the morning when the power converter 20 has not yet started its operation or shows a change in the evening when the power converter 20 has just stopped, the stop determination unit 110 may determine that the power converter 20 is in stoppage.

When the voltage value Vin is larger than the first reference voltage value Vt1, and a change in the voltage value Vin satisfies a predetermined condition, the stop determination unit 110 may determine that the power converter 20 is in stoppage. When the voltage value Vin is larger than the first reference voltage value Vt1, a change in the voltage value Vin satisfies a predetermined condition, and the present timing is included in a predetermined time period, the stop determination unit 110 may determine that the power converter 20 is in stoppage.

In the embodiment, the ground fault detector 112 detects a ground fault of the solar battery 10 when the stop determination unit 110 determines that the power converter 20 is in stoppage. However, the power converter 20 does not necessarily need to be in stoppage when the disconnection unit 32 is capable of being operated in the case where the current flowing in the disconnection unit 32 is small.

Thus, when the voltage value Vin acquired by the voltage value acquisition unit 106 is larger than the first reference voltage value Vt1 and smaller than the second reference voltage value Vt2, the ground fault detector 112 may detect a ground fault of the solar battery 10 in the state where the solar battery 10 and the power converter 20 are electrically disconnected from each other by the disconnection unit 32, without determining whether the power converter 20 is in stoppage. When the voltage value Vin is larger than the first reference voltage value Vt1 and a change in the voltage value Vin satisfies a predetermined condition, the ground fault detector 112 may detect a ground fault of the solar battery 10 in the state where the solar battery 10 and the power converter 20 are electrically disconnected from each other by the disconnection unit 32, without determining whether the power converter 20 is in stoppage.

When the voltage value Vin acquired by the voltage value acquisition unit 106 is larger than the first reference voltage value Vt1 and smaller than the second reference voltage value Vt2, and the present timing is included in a predetermined period, for example, included in a period in the morning or a period in the evening, the ground fault detector 112 may detect a ground fault of the solar battery 10 in the state where the solar battery 10 and the power converter 20 are electrically disconnected from each other, without determining whether the power converter 20 is in stoppage.

When the solar radiation amount acquired by the solar radiation amount acquisition unit 104 satisfies a predetermined condition, for example, when a change in the solar radiation amount shows a change in the morning or a change in the evening, the ground fault detector 112 may detect a ground fault of the solar battery 10 in the state where the solar battery 10 and the power converter 20 are electrically disconnected from each other by the disconnection unit 32, without determining whether the power converter 20 is in stoppage.

When the solar radiation amount acquired by the solar radiation amount acquisition unit 104 satisfies a predetermined condition, and the voltage value Vin acquired by the voltage value acquisition unit 106 is larger than the first reference voltage value Vt1 and smaller than the second reference voltage value, the ground fault detector 112 may detect a ground fault of the solar battery 10 in the state where the solar battery 10 and the power converter 20 are electrically disconnected from each other by the disconnection unit 32. When a change in the solar radiation amount acquired by the solar radiation amount acquisition unit 104 shows a change in the morning or a change in the evening, and the voltage value Vin is larger than the first reference voltage value Vt1 and smaller than the second reference voltage value Vt2, the ground fault detector 112 may detect a ground fault of the solar battery 10 in the state where the solar battery 10 and the power converter 20 are electrically disconnected from each other by the disconnection unit 32.

Figure 5:
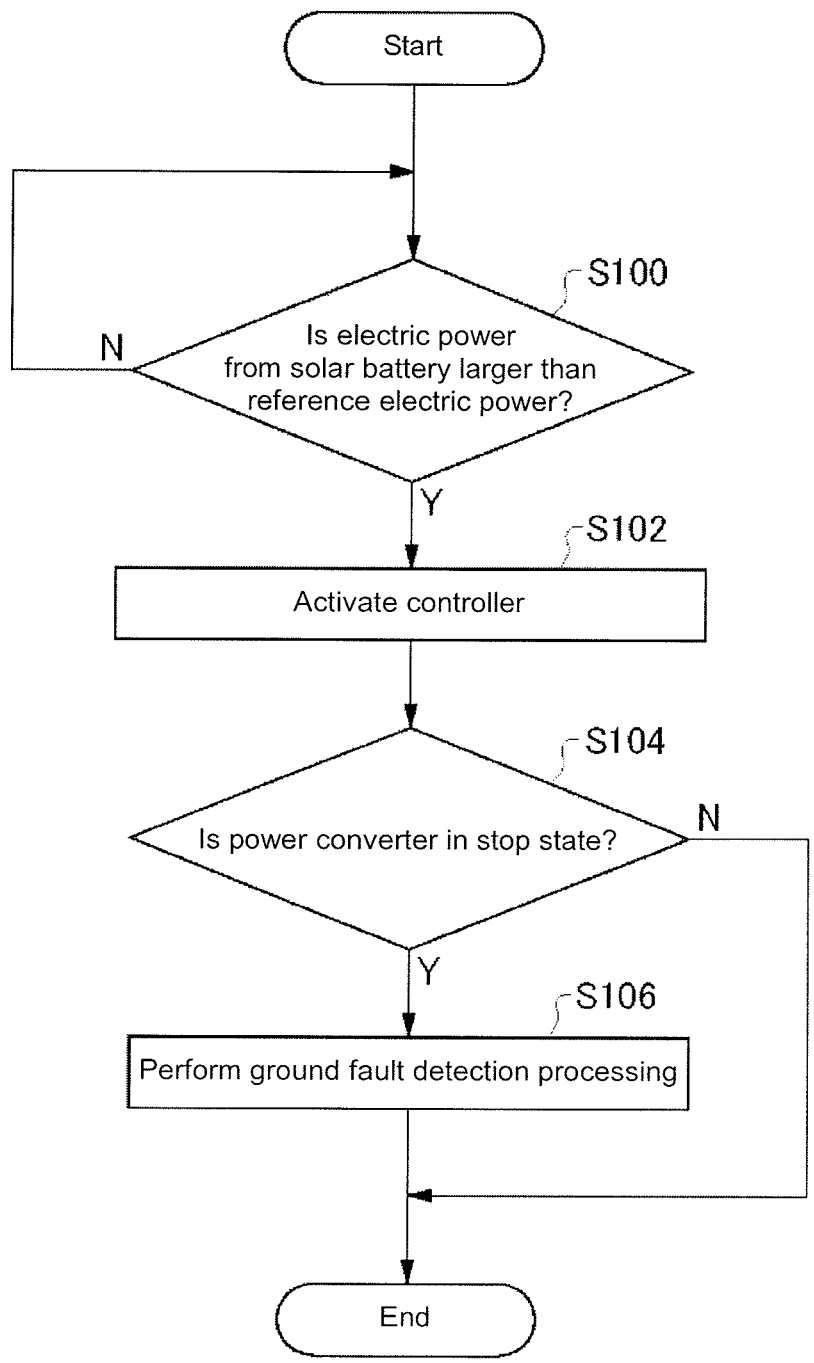
FIG. 5 is a diagram illustrating an example of a flowchart in a case where the ground fault detection device performs a processing for detecting a ground fault of a solar battery in the morning.

FIG. 5 illustrates an example of a flowchart in a case where the ground fault detection device 30 performs a processing for detecting a ground fault of the solar battery 10 in the morning.

In the morning, when the amount of the sunlight irradiating the solar battery 10 gradually increases, and the electric power output from the solar battery 10 reaches a reference electric power enough to activate the microcomputer of the controller 100 (S100), the power supply unit 44 starts to supply electric power to the controller 100 to activate the controller 100 (S102). When the controller 100 is activated, the stop determination unit 110 determines whether the power converter 20 is in a stop state (S104).

The stop determination unit 110 may determine whether the power converter 20 is in a stop state based on at least one of the current value I0 acquired by the current value acquisition unit 102, the solar radiation amount acquired by the solar radiation amount acquisition unit 104, the voltage value Vin acquired by the voltage value acquisition unit 106, and the present time acquired by the time acquisition unit 108. The stop determination unit 110 may also determine whether the power converter 20 is in a stop state based on at least two of the current value I0 acquired by the current value acquisition unit 102, the solar radiation amount acquired by the solar radiation amount acquisition unit 104, the voltage value Vin acquired by the voltage value acquisition unit 106, and the present time acquired by the time acquisition unit 108.

The stop determination unit 110 may acquire, from the power converter 20, the information indicating the operation state of the power converter 20 to determine that the power converter 20 is in a stop state when the acquired information shows that the power converter 20 is in a stop state. The stop determination unit 110 may also determine that the power converter 20 is in a stop state when the stop determination unit 110 has received no operation start signal from the power converter 20 after receiving an operation stop signal from the power converter 20.

When the stop determination unit 110 determines that the power converter 20 is in a stop state, the ground fault detector 112 derives the resistance value R0 of the insulation resistor 200 of the solar battery 10 according to Equation (5) based on the voltage V1, voltage V2, and voltage V0 detected by the voltage detector 40, and detects the presence or absence of a ground fault of the solar battery 10 based on the resistance value R0 (S106). When the resistance value R0 is not less than the predetermined reference resistance value Rt, the ground fault detector 112 determines that no ground fault occurs in the solar battery 10. When the resistance value R0 is less than the reference resistance value Rt, the ground fault detector 112 determines that a ground fault occurs in the solar battery 10.

Figure 6:
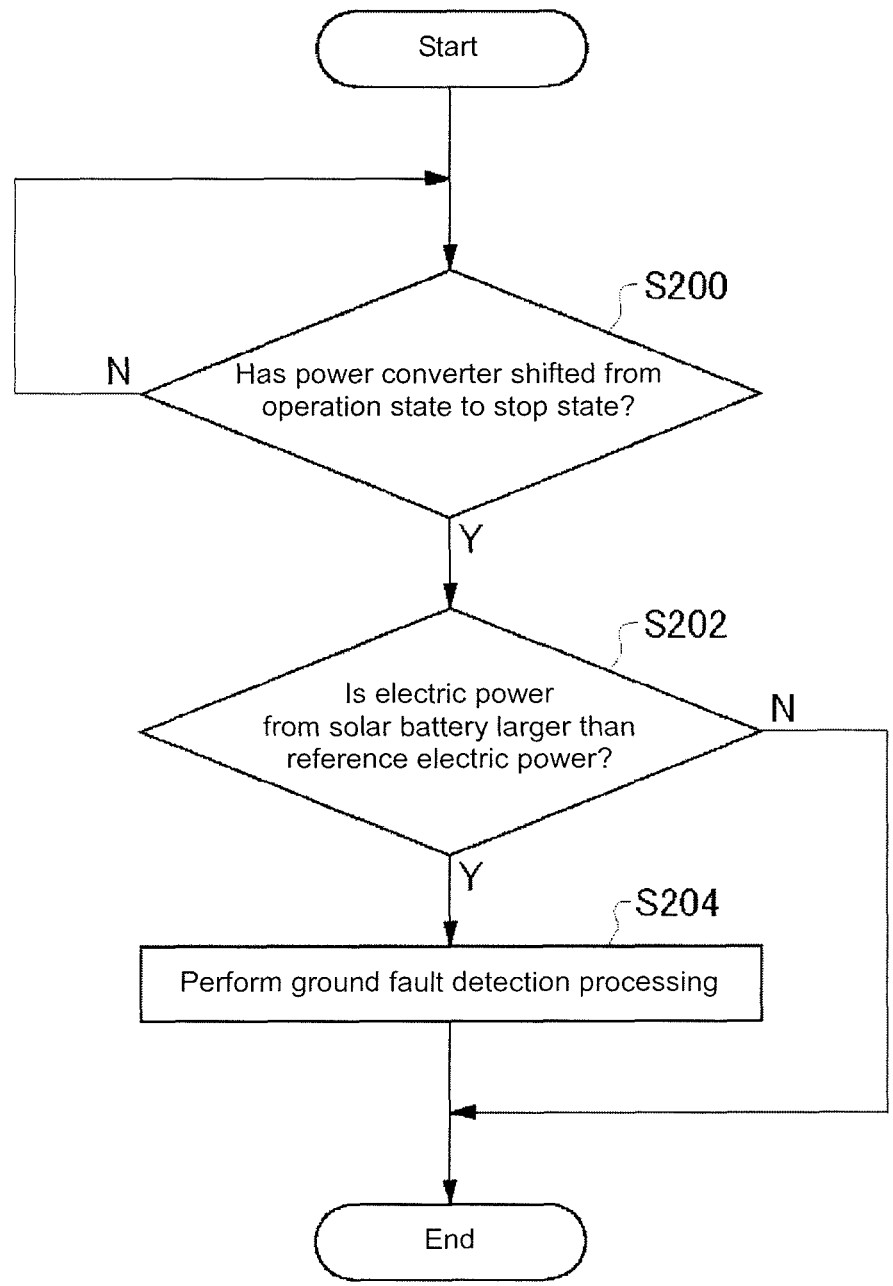
FIG. 6 is a diagram illustrating an example of a flowchart in a case where the ground fault detection device performs a processing for detecting a ground fault of the solar battery in the evening.

FIG. 6 illustrates an example of a flowchart when the ground fault detection device 30 performs a processing for detecting a ground fault of the solar battery 10 in the evening.

The stop determination unit 110 determines whether the power converter 20 has shifted from an operation state to a stop state (S200). When the present time acquired by the time acquisition unit 108 shows a predetermined time period indicating evening, and the voltage value Vin acquired by the voltage value acquisition unit 106 is smaller than the second reference voltage value Vt2, the stop determination unit 110 may determine that the power converter 20 has shifted from an operation state to a stop state. When a change in the solar radiation amount acquired by the solar radiation amount acquisition unit 104 shows a change in the solar radiation amount in the evening, and the voltage value Vin acquired by the current value acquisition unit 102 is smaller than the second reference voltage value Vt2, the stop determination unit 110 may determine that the power converter 20 has shifted from an operation state to a stop state. When the present time acquired by the time acquisition unit 108 shows a predetermined time period indicating evening, and a change in the voltage value Vin acquired by the voltage value acquisition unit 106 rapidly increases and then shows a change, i.e. a decrease, the stop determination unit 110 may determine that the power converter 20 has shifted from an operation state to a stop state.

When the stop determination unit 110 determines that the power converter 20 has shifted from an operation state to a stop state, the ground fault detector 112 determines whether the electric power from the solar battery 10 is larger than a reference electric power that allows detection of a ground fault of the solar battery 10 (S202). When the voltage value Vin acquired by the current value acquisition unit 102 is larger than the first reference voltage value Vt1, the ground fault detector 112 may determine that the electric power from the solar battery 10 is larger than a reference electric power that allows detection of a ground fault of the solar battery 10.

When the electric power from the solar battery 10 is larger than a reference electric power, the ground fault detector 112 derives the resistance value R0 of the resistor 200 of the solar battery 10 according to Equation (5) based on the voltage V1, voltage V2, and voltage V0 detected by the voltage detector 40, and detects the presence or absence of a ground fault of the solar battery 10 based on the resistance value R0 (S204). When the resistance value R0 is not less than the predetermined reference resistance value Rt, the ground fault detector 112 determines that no ground fault occurs in the solar battery 10. When the resistance value R0 is less than the predetermined reference resistance value Rt, the ground fault detector 112 determines that a ground fault occurs in the solar battery 10.

As described above, according to the embodiment, when the current flowing in the disconnection unit 32 is small, the ground fault detector 112 detects a ground fault of the solar battery 10 in a state where the solar battery 10 and the power converter 20 are electrically disconnected from each other by the disconnection unit 32. This eliminates the need to select components resistant to a great current as the components making up the disconnection unit 32 on the assumption that the current flowing in the disconnection unit 32 is large. Moreover, this eliminates the need to select expensive components resistant to a great current as the relays making up the disconnection unit 32. This also allows the relays making up the disconnection unit 32 to be downsized.

As described above, the invention is described with reference to the embodiment, but the technical scope of the invention is not limited to the scope described in the embodiment. It is apparent that those skilled in the art can make various alterations or improvements to the above embodiment. It is apparent from the description of the scope of the claims that the embodiments added with such alterations or improvements can be included in the technical scope of the invention.

Note that, the execution order of the processes of operations, procedures, steps, stages, or the like in the apparatus, system, program, and method illustrated in the claims, specification, and drawings may be implemented in any order unless "earlier", "prior to" or the like is specified or the output of the previous processing is used in the subsequent processing. Even when any operation flow in the claims, specification, and the drawings is illustrated using "first," "then," or the like for convenience, it is non-essential to carry out the flow in this order.

DESCRIPTION OF SYMBOLS 10 solar battery
20 power converter
30 ground fault detection device
32 disconnection unit
34, 36 switch
38 resistor
40 voltage detector
44 power supply unit
100 controller
102 current value acquisition unit
104 solar radiation amount acquisition unit
106 voltage value acquisition unit
108 time acquisition unit
110 stop determination unit
112 ground fault detector
114 condition storage unit

The invention claimed is:
1. A ground fault detection device comprising:
a processor; and
a memory including a set of executable instructions that, when executed by the processor, causes the processor to perform operations including:
acquiring a voltage value of a voltage output from a solar battery;
determining whether a power converter for converting electric power from the solar battery is in stoppage; and
detecting a ground fault of the solar battery in a state where the solar battery and the power converter are electrically disconnected from each other by a relay arranged between the solar battery and the power converter when the processor determines that the power converter is in stoppage, wherein:
the processor detects the ground fault of the solar battery when the voltage value acquired from the solar battery is larger than a first reference voltage value,
the processor determines that the power converter is in stoppage when the voltage value acquired from the solar battery is smaller than a second reference voltage value.

2. The ground fault detection device according to claim 1, wherein
the processor determines that the power converter is in stoppage when the voltage value acquired from the solar battery is smaller than the second reference voltage value, and a present timing is included in a predetermined period.

3. The ground fault detection device according to claim 1, wherein
the processor further determines that the power converter is in stoppage when a change in the voltage value acquired from the solar battery satisfies a predetermined condition.

4. The ground fault detection device according to claim 3, wherein
the processor determines that the power converter is in stoppage when the change in the voltage value acquired from the solar battery satisfies the predetermined condition, and a present timing is included in a predetermined period.

5. The ground fault detection device according to claim 1, wherein
the operations further include:
acquiring a current value of a current output from the solar battery, and
the processor determines that the power converter is in stoppage when the voltage value acquired from the solar battery is smaller than the second reference voltage value, and the current value acquired from the solar battery is smaller than a reference current value.

6. The ground fault detection device according to claim 5, wherein
the processor determines that the power converter is in stoppage when the voltage value acquired from the solar battery is smaller than the second reference voltage value, the current value acquired from the solar battery is smaller than the reference current value, and a present timing is included in a predetermined period.

7. The ground fault detection device according to claim 1, wherein
the operations further include:
acquiring a solar radiation amount, and
the processor further determines that the power converter is in stoppage when the solar radiation amount satisfies a predetermined condition.

8. The ground fault detection device according to claim 7, wherein
the processor determines that the power converter is in stoppage when the solar radiation amount satisfies the predetermined condition, and the voltage value acquired from the solar battery is smaller than the second reference voltage value.

9. The ground fault detection device according to claim 8, wherein
the operations further include:
acquiring a current value of a current output from the solar battery, and the processor determines that the power converter is in stoppage when the solar radiation amount satisfies the predetermined condition, the voltage value acquired from the solar battery is smaller than the second reference voltage value, and the current value acquired from the solar battery is smaller than a reference current value.

10. The ground fault detection device according to claim 7, wherein
the processor determines that the power converter is in stoppage when the solar radiation amount satisfies the predetermined condition, and a change in the voltage value acquired from the solar battery satisfies a second predetermined condition.

11. The ground fault detection device according to claim 1, wherein
the relay includes a b-contact.

12. The ground fault detection device according to claim 1, further comprising:
a power supply configured to supply electric power from the solar battery to the ground fault detection device.

13. A non-transitory computer readable medium storing a program for causing a computer to function as the ground fault detection device according to claim 1.

14. A ground fault detection device comprising:
a processor; and
a memory including a set of executable instructions that, when executed by the processor, causes the processor to perform operations including:
acquiring a voltage value of a voltage output from a solar battery; and
detecting a ground fault of the solar battery in a state where the solar battery and a power converter for converting electric power from the solar battery are electrically disconnected from each other by a relay arranged between the solar battery and the power converter when the voltage value acquired from the solar battery is larger than a first reference voltage value and smaller than a second reference voltage value, or when the voltage value is larger than the first reference voltage value, and a change in the voltage value satisfies a predetermined condition.

15. The ground fault detection device according to claim 14, wherein the operations further include:
detecting a ground fault of the solar battery in a state where the solar battery and the power converter are electrically disconnected from each other by the relay when the voltage value acquired from the solar battery is larger than the first reference voltage value and smaller than the second reference voltage value, and a present timing is included in a predetermined period, or when the voltage value is larger than the first reference voltage value, the change in the voltage value satisfies the predetermined condition, and the present timing is included the predetermined period.

16. The ground fault detection device according to claim 14, wherein the relay includes a b-contact.

17. The ground fault detection device according to claim 14, further comprising:
a power supply configured to supply electric power from the solar battery to the ground fault detection device.

18. A non-transitory computer readable medium storing a program for causing a computer to function as the ground fault detection device according to claim 14.

19. A ground fault detection device comprising:
a processor; and
a memory including a set of executable instructions that, when executed by the processor, causes the processor to perform operations including:
acquiring a voltage value of a voltage output from a solar battery;
acquiring a current value of a current output from the solar battery; and
detecting a ground fault of the solar battery in a state where the solar battery and a power converter for converting electric power from the solar battery are electrically disconnected from each other by a relay arranged between the solar battery and the power converter when the voltage value acquired from the solar battery is larger than a reference voltage value, and the current value acquired from the solar battery is smaller than a reference current value.

20. The ground fault detection device according to claim 19, wherein the relay includes a b-contact.

21. The ground fault detection device according to claim 19, further comprising:
a power supply configured to supply electric power from the solar battery to the ground fault detection device.

22. A non-transitory computer readable medium storing a program for causing a computer to function as the ground fault detection device according to claim 19.

23. A ground fault detection device, comprising:
a processor; and
a memory including a set of executable instructions that, when executed by the processor, causes the processor to perform operations including:
acquiring a voltage value of a current output from a solar battery;
acquiring a solar radiation amount; and
detecting a ground fault of the solar battery in a state where the solar battery and a power converter for converting electric power from the solar battery are electrically disconnected from each other by a relay arranged between the solar battery and the power converter when the solar radiation amount satisfies a predetermined condition, wherein
the processor detects the ground fault of the solar battery in the state where the solar battery and the power converter are electrically disconnected from each other by the relay when the solar radiation amount satisfies the predetermined condition, and the voltage value acquired from the solar battery is larger than a first reference voltage value and smaller than a second reference voltage value, or when the solar radiation amount satisfies the predetermined condition, the voltage value is larger than the first reference voltage value, and a change in the voltage value satisfies a second predetermined condition.

24. The ground fault detection device according to claim 23, wherein
the relay includes a b-contact.

25. The ground fault detection device according to claim 23, further comprising:
a power supply configured to supply electric power from the solar battery to the ground fault detection device.

26. A non-transitory computer readable medium storing a program for causing a computer to function as the ground fault detection device according to claim 23.

* * * * *